(12) United States Patent
Azumo et al.

(10) Patent No.: US 12,456,620 B2
(45) Date of Patent: Oct. 28, 2025

(54) FILM-FORMING METHOD

(71) Applicant: Tokyo Electron Limited, Tokyo (JP)

(72) Inventors: Shuji Azumo, Nirasaki (JP); Masahito Sugiura, Nirasaki (JP); Takashi Matsumoto, Nirasaki (JP); Yumiko Kawano, Nirasaki (JP); Shinichi Ike, Nirasaki (JP); Kenji Ouchi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 860 days.

(21) Appl. No.: 17/762,230

(22) PCT Filed: Sep. 16, 2020

(86) PCT No.: PCT/JP2020/035097
§ 371 (c)(1),
(2) Date: Nov. 10, 2022

(87) PCT Pub. No.: WO2021/060110
PCT Pub. Date: Apr. 1, 2021

(65) Prior Publication Data
US 2023/0148162 A1    May 11, 2023

(30) Foreign Application Priority Data
Sep. 24, 2019 (JP) .................. 2019-173471

(51) Int. Cl.
*H01L 21/027* (2006.01)
*B82Y 30/00* (2011.01)
(Continued)

(52) U.S. Cl.
CPC .......... *H01L 21/0271* (2013.01); *B82Y 30/00* (2013.01); *C23C 16/042* (2013.01); *C23C 16/06* (2013.01); *C23C 16/30* (2013.01)

(58) Field of Classification Search
CPC .......... H01L 21/0271; H01L 23/53276; H10K 85/221; H10K 10/491; B82Y 30/00;
(Continued)

(56) References Cited

U.S. PATENT DOCUMENTS

| | | | |
|---|---|---|---|
| 2005/0048697 A1* | 3/2005 | Uang ................... | H05K 3/4007 257/E23.021 |
| 2006/0286851 A1* | 12/2006 | Sato .................. | H01L 23/53276 257/E21.586 |
| 2010/0056009 A1* | 3/2010 | Wang ...................... | H01J 29/04 445/24 |

FOREIGN PATENT DOCUMENTS

JP    2007501902 A    2/2007

* cited by examiner

*Primary Examiner* — Brook Kebede
(74) *Attorney, Agent, or Firm* — Nath, Goldberg & Meyer; Jerald L. Meyer; Tanya E. Harkins (57) ABSTRACT

The present disclosure provides a technique capable of controlling a shape of an SAM. Provided is a method of forming a target film on a substrate, wherein the method includes preparing a substrate including a layer of a first conductive material formed on a surface of a first region, and a layer of an insulating material formed on a surface of a second region; forming carbon nanotubes on a surface of the layer of the first conductive material; and supplying a raw material gas for a self-assembled film to form the self-assembled film in a region of the surface of the layer of the first conductive material in which the carbon nanotubes have not been formed.

14 Claims, 6 Drawing Sheets

(51) Int. Cl.
*C23C 16/04* (2006.01)
*C23C 16/06* (2006.01)
*C23C 16/30* (2006.01)

(58) Field of Classification Search
CPC ....... C23C 16/042; C23C 16/06; C23C 16/30; C01B 32/162
See application file for complete search history.

FILM-FORMING METHOD

CROSS REFERENCE TO RELATED APPLICATION

This is a National Phase Application filed under 35 U.S.C. 371 as a national stage of PCT/JP2020/035097, filed Sep. 16, 2020, an application claiming the benefit of Japanese Patent Application No. 2019-173471, filed Sep. 24, 2019, the content of each of which is hereby incorporated by reference in its entirety.

TECHNICAL FIELD

The present disclosure relates to a film forming method.

BACKGROUND

Patent Document 1 discloses a technique for selectively forming a target film on a specific region of a substrate without using photolithography. Specifically, a technique is disclosed in which a self-assembled monolayer (SAM) that inhibits formation of a target film is formed in a partial region of the substrate and the target film is formed in the remaining region of the substrate.

PRIOR ART DOCUMENT

Patent Document

Patent Document 1: Japanese Laid-Open Patent Publication No. 2007-501902

SUMMARY OF THE INVENTION

Problem to be Solved by the Invention

The present disclosure provides a technique capable of controlling a shape of an SAM.

Means for Solving Problem

According to an aspect of the present disclosure, there is provided a method of forming a target film on a substrate, which includes preparing a substrate including a layer of a first conductive material formed on a surface of a first region, and a layer of an insulating material formed on a surface of a second region; forming carbon nanotubes on a surface of the layer of the first conductive material; and supplying a raw material gas for a self-assembled film to form a self-assembled film on a region of the surface of the layer of the first conductive material in which the carbon nanotubes have not been formed.

Effect of the Invention

According to an aspect, it is possible to control a shape of an SAM.

DETAILED DESCRIPTION

Hereinafter, embodiments for executing the present disclosure will be described with reference to drawings. In the specification and figures, constituent elements that are substantially the same in configuration will be denoted by the same reference numerals, and redundant descriptions may be omitted. Hereinbelow, a description will be made using a vertical direction or relationship in the figures, but it does not represent a universal vertical direction or relationship.

First Embodiment

Figure 1:
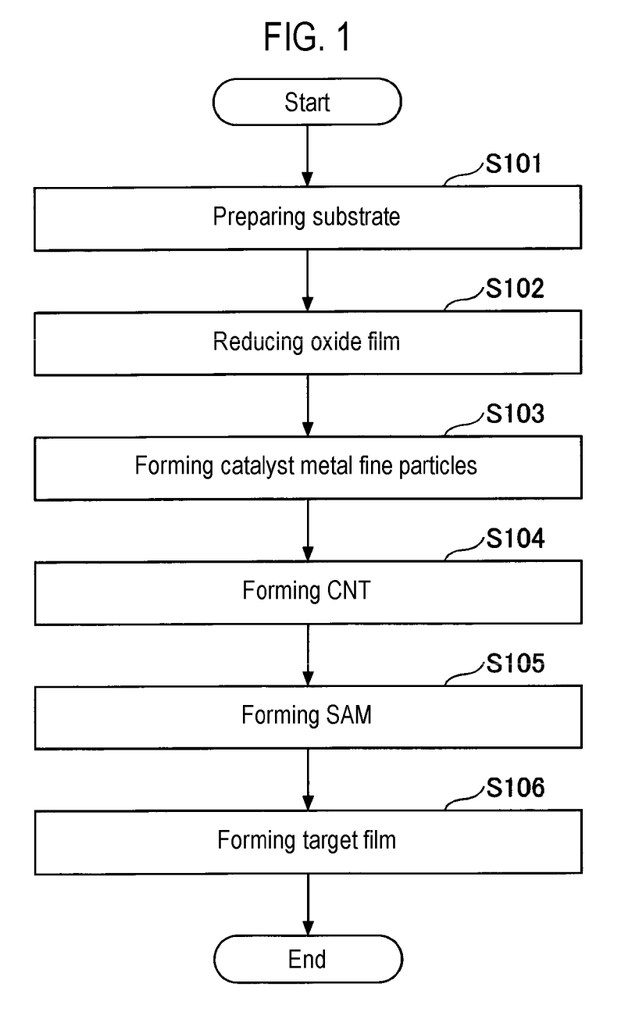
FIG. 1 is a flowchart illustrating a film forming method according to a first embodiment.

FIG. 1 is a flowchart illustrating a film forming method according to a first embodiment. FIGS. 2A to 2F are cross-sectional views illustrating examples of the states of a substrate in respective steps illustrated in FIG. 1. FIGS. 2A to 2F illustrate states of a substrate 10 corresponding to respective steps S101 to S106 illustrated in FIG. 1.

Figure 2A:
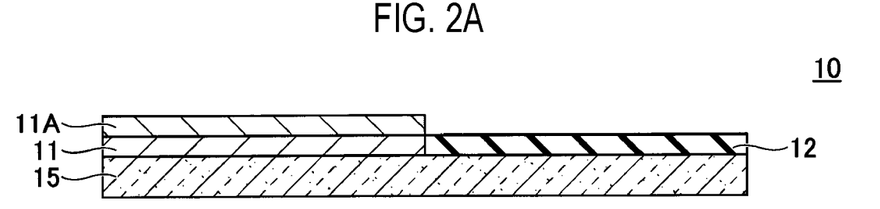
FIG. 2A is a cross-sectional view illustrating an example of a state of a substrate in each step illustrated in FIG. 1.

As illustrated in FIG. 2A, a film forming method includes step S101 of preparing the substrate 10. Preparing the substrate 10 includes, for example, loading the substrate 10 into, for example, a processing container (chamber) of a film forming apparatus. The substrate 10 includes a conductive film 11, a natural oxide film 11A, an insulating film 12, and a base substrate 15.

The substrate 10 has a first region A1 and a second region A2. Here, as an example, the first region A1 and the second region A2 are adjacent to each other in a plan view. The conductive film 11 is provided on the top surface side of the base substrate 15 in the first region A1, and the insulating film 12 is provided on the top surface side of the base substrate 15 in the second region A2. The natural oxide film 11A is provided on the top surface of the conductive film 11 in the first region A1. In FIG. 2A, the natural oxide film 11A and the insulating film 12 are exposed on the surface of the substrate 10.

The number of first regions A1 is one in FIG. 2A, but may be two or more. For example, two first regions A1 may be arranged with a second region A2 interposed therebetween.

Similarly, the number of second regions A2 is one in FIG. 2A, but may be two or more. For example, two second regions A2 may be arranged with a first region A1 interposed therebetween.

In addition, only the first region A1 and the second region A2 are present in FIG. 2A, but a third region may be further present. The third region is a region in which a layer made of a material different from those of the conductive film 11 in the first region A1 and the insulating film 12 in the second region A2 is exposed. The third region may be arranged between the first region A1 and the second region A2, or may be arranged outside the first region A1 and the second region A2.

The conductive film 11 is an example of a layer of the first conductive material. The first conductive material is a metal such as copper (Cu), cobalt (Co), or ruthenium (Ru). The surface of such a metal naturally oxidizes in the atmosphere over time. The oxide is the natural oxide film 11A. The natural oxide film 11A is removable through a reduction process.

Here, as an example, a mode in which the conductive film 11 is copper (Cu) and the natural oxide film 11A is a copper oxide formed through natural oxidation will be described. The copper oxide as the natural oxide film 11A may include CuO and Cu2O.

The insulating film 12 is an example of a layer of an insulating material, and may be an insulating film made of a so-called low-k material having a low dielectric constant. The insulating material of the insulating film 12 is, for example, an insulating material containing silicon (Si), such as silicon oxide, silicon nitride, silicon oxynitride, silicon carbide, or silicon oxycarbonitride. Hereinafter, silicon oxide is also referred to as SiO regardless of the composition ratio of oxygen and silicon. Similarly, silicon nitride is also referred to as SiN, silicon oxynitride is also referred to as SiON, silicon carbide is also referred to as SiC, and silicon oxycarbonitride is also referred to as SiOCN. The insulating film 12 is a SiO film in this embodiment.

The base substrate 15 is a semiconductor substrate such as a silicon wafer. The substrate 10 may further include, between the base substrate 15 and the conductive film 11, a base film formed of a material different from those of the base substrate 15 and the conductive film 11. Similarly, the substrate 10 may further include, between the base substrate 15 and the insulating film 12, a base film formed of a material different from those of the base substrate 15 and the insulating film 12.

Such a base film may be, for example, a SiN layer or the like. The SiN layer or the like may be, for example, an etching stop layer that stops etching.

Figure 2B:
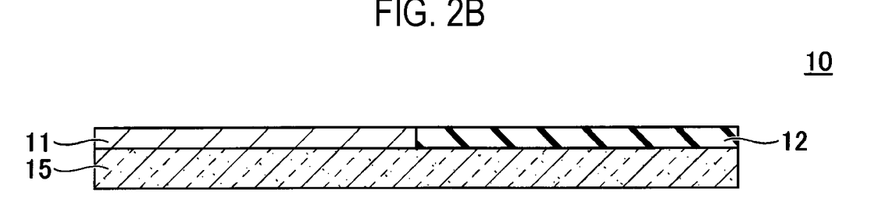
FIG. 2B is a cross-sectional view illustrating an example of a state of the substrate in each step illustrated in FIG. 1.

The film forming method includes step S102 of manufacturing the substrate 10 as illustrated in FIG. 2B by reducing the natural oxide film 11A (see FIG. 2A). In order to reduce the natural oxide film 11A, for example, flow rates of hydrogen (H2) and argon (Ar) in the processing container of the film forming apparatus are set to 100 sccm and 2,500 sccm, respectively, and an internal pressure of the processing container is set to 1 torr to 10 torr (about 133.32 Pa to about 1,333.22 Pa). Then, a susceptor is heated such that the temperature of the substrate 10 is 150 degrees C. to 200 degrees C. under a hydrogen atmosphere in which hydrogen is less than 0.5% of an atmospheric gas within the processing container.

Through step S102, a copper oxide as the natural oxide film 11A is reduced to Cu and removed. As a result, as illustrated in FIG. 2B, the substrate 10 including the conductive film 11, the insulating film 12, and the base substrate 15 is obtained. Cu as the conductive film 11 is exposed on the surface of the first region A1 of the substrate 10. The reduction process on the natural oxide film 11A is not limited to a dry process, but may be a wet process. As an example, step S102 may be performed in the same processing container in which step S101 is performed.

Figure 2C:
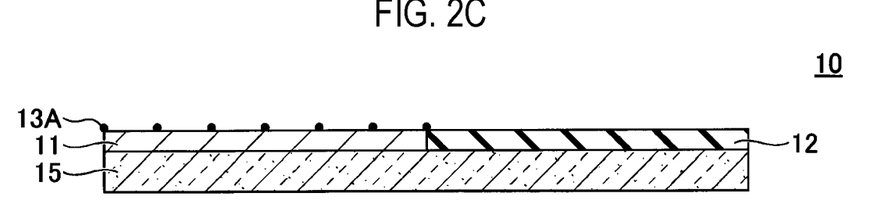
FIG. 2C is a cross-sectional view illustrating an example of a state of the substrate in each step illustrated in FIG. 1.

The film forming method includes step S103 of forming catalyst metal fine particles 13A on the surface of the conductive film 11 as illustrated in FIG. 2C. The catalyst metal fine particles 13A are an example of catalyst metal fine particles of a second conductive material, and the second conductive material is, for example, a transition metal such as cobalt (Co) or nickel (Ni), or an alloy containing the transition metal. The catalyst metal fine particles 13A later cause a catalytic action in forming carbon nano tubes (CNTs) and become nuclei or seeds in the growth of CNTs. The size of the catalyst metal fine particles 13A is, for example, 1 nm to 5 nm. In the present embodiment, a mode in which the catalyst metal fine particles 13A are Co fine particles will be described.

The catalyst metal fine particles 13A may be formed, for example, on the surface of the conductive film 11 as follows.

First, a Co thin film is formed on the surface of the conductive film 11 through a thermal chemical vapor deposition (CVD) method. The internal pressure of the processing container of the film forming apparatus may be set to 1 Torr to 10 Torr (about 133.32 Pa to about 1,333.22 Pa), the susceptor may be heated such that the substrate temperature becomes 300 degrees C., and cobalt carbonyl (Co2(CO)s) gas vaporized by preheating with a gas supply mechanism may be supplied into the processing container together with a diluting gas (e.g., Ar gas or N2 gas) to form a Co thin film on the surface of the conductive film 11. The substrate temperature in this process may be 300 degrees C. or lower at which Co-agglutination does not occur. The Co thin film may be formed by a sputtering method, a vapor deposition method, or the like, without being limited to the thermal CVD method.

Subsequently, oxygen plasma process is performed on the Co thin film by heating the substrate 10 and generating microwave plasma of an oxygen (O2) gas and an argon (Ar) gas. When the oxygen plasma process is performed in this way, organic substances or the like adhering to the surface of the Co thin film can be removed so that the surface of the Co thin film can be cleaned. As a result, migration due to heating is likely to occur on the surface of the Co thin film, and Co-agglomeration occurs so that Co is turned into fine particles. In this way, island-shaped catalyst metal fine particles 13A may be formed on the surface of the conductive film 11.

As process conditions for the oxygen plasma process, for example, the internal pressure of the processing container of the film forming apparatus may be set to 67 Pa to 533 Pa, the susceptor may be heated such that the temperature of the substrate IO becomes 300 degrees C. to 600 degrees C., and the flow rates of the O2 gas and the Ar gas may be set to 50 sccm to 200 sccm, and 300 sccm to 600 sccm, respectively, and the microwave output may be set to 250 W to 2,000 W. In the oxygen plasma process, an oxygen-containing gas such as H2O, O, O3, or N2O may be used instead of the O2 gas.

After the oxygen plasma process, an activation process is performed. In the activation process, microwave plasma of a hydrogen (H2) gas and an Ar gas is generated to reduce and activate the surfaces of the catalyst metal fine particles 13A. By the activation process, the oxide films on the surfaces of the catalyst metal fine particles 13A formed by the oxygen plasma process are removed, and the catalyst metal fine particles 13A can be further increased in density while maintaining the state of the fine particles.

As process conditions for the activation process, for example, the internal pressure of the processing container of the film forming apparatus may be set to 67 Pa to 533 Pa, the susceptor may be heated such that the temperature of the substrate 10 becomes 300 degrees C. to 600 degrees C., and the flow rates of the H2 gas and the Ar gas may be set to 100 sccm to 1,200 sccm, and 300 sccm to 600 sccm, respectively, and the microwave output may be set to 250 W to 2,000 W. In the activation process, a hydrogen-containing gas such as an ammonia (NH3) gas may be used instead of the H2 gas.

As illustrated in FIG. 2C, the catalyst metal fine particles 13A are formed on the surface of the conductive film 11 in step S103, and thus the substrate 10 including the conductive film 11, the insulating film 12, the catalyst metal fine particles 13A, and the base substrate 15 is obtained. In FIG. 2C, the conductive film 11, the catalyst metal fine particles 13A, and the insulating film 12 are exposed on the surface of the substrate 10. As an example, step S103 may be performed in the same processing container in which step S102 is performed.

Figure 2D:
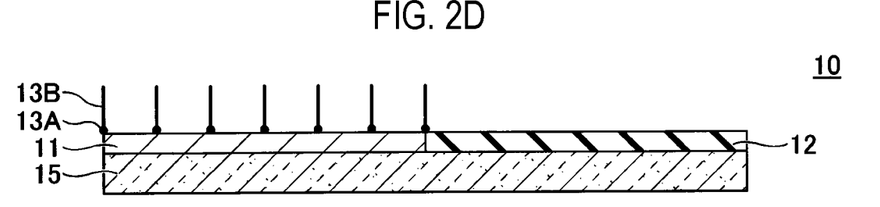
FIG. 2D is a cross-sectional view illustrating an example of a state of the substrate in each step illustrated in FIG. 1.

As illustrated in FIG. 2D, the film forming method includes step S104 of forming CNTs 13B. The CNTs 13B are formed on the catalyst metal fine particles 13A and grows vertically on the surfaces of the substrate 10 and the conductive film 11 in the first region A1. The CNTs 13B, together with the SAM formed later, inhibit the formation of a target film 14 to be described later. The CNTs 13B are not formed in the second region A2.

The CNTs 13B may be grown by decomposing a carbon-containing gas (carbon source gas) such as methane (CH4), ethylene (C2H4), ethane (C2H6), or propylene (C3H6) by plasma, and by using the catalytic action of the fine paliicles 13A. In this way, the CNTs 13B can be grown on the catalyst metal fine particles 13A. The CNTs 13B grow vertically on the surface of the conductive film 11 due to a vertical orientation.

Under process conditions for forming CNTs 13B, film formation is, for example, as follows. Here, a mode in which the C2H4 gas is used as the carbon source gas will be described. The CNTs 13B may be grown by setting the internal pressure of the processing container of the film forming apparatus to 67 Pa to 533 Pa, heating the susceptor such that the temperature of the substrate 10 becomes 300 degrees C. to 600 degrees C., causing the C2H4 gas, the H2 gas, and the Ar gas to flow at 5 sccm to 150 sccm, 100 sccm to 1,200 sccm, and 300 sccm to 600 sccm, respectively, and setting the microwave output to 250 W to 2,000 W to generate microwave plasma. A hydrogen-containing gas such as an ammonia (NH3) gas may be used instead of the H2 gas.

The height of the CNTs 13B is preferably higher than that of the target film 14 to be formed later. This is to suppress the infiltration of the target film 14 into the first region A1. The height of CNTs 13B is, for example, about 10 nm to 25 nm.

As illustrated in FIG. 2D, the catalyst metal fine particles 13A and the CNTs 13B are formed on the surface of the conductive film 11 in step S104, and thus the substrate 10 including the conductive film 11, the insulating film 12, the catalyst metal fine particles 13A, the CNTs 13B, and the base substrate 15 is obtained. In FIG. 2D, the conductive film 11, the catalyst metal fine particles 13A, the CNTs 13B, and the insulating film 12 are exposed on the surface of the substrate 10. Since the catalyst metal fine particles 13A are scattered on the surface of the conductive film 11, there are gaps between the CNTs 13B, and the conductive film 11 are exposed from the gaps. As an example, step S104 may be performed in the same processing container in which step S103 is performed.

Figure 2E:
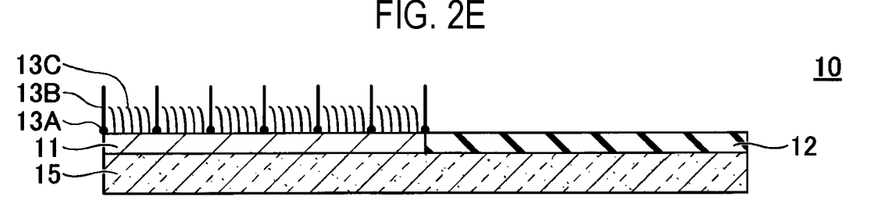
FIG. 2E is a cross-sectional view illustrating an example of a state of the substrate in each step illustrated in FIG. 1.

As illustrated in FIG. 2E, the film forming method includes step S105 of forming an SAM 13B. The SAM 13C is adsorbed on the surface of the conductive film 11 exposed from the gaps of the CNTs 13B of the first region A1, and grows vertically on the surface of the conductive film 11 while being corrected in the vertical direction by the CNTs 13B. The SAM 13C cooperates with the CNTs 13B to inhibit the formation of the target film 14 to be described later. The SAM 13C is not formed in the second region A2. In general, when the SAM is formed at a high density, the SAM exhibits high orientation by virtue of the van der Waals force between molecules and tends to be oriented diagonally with respect to the surface of the film. In the present embodiment, the SAM 13C grows vertically on the surface of the conductive film 11 by being corrected by the CNTs 13B formed vertically on the surface of the conductive film 11.

An organic compound for forming the SAM 13 may have any of fluorocarbon-based functional group (CFx) or alkyl-based functional group (CHx) as long as it is a thiol-based compound. For example, CH3(CH2)[x]CH2SH [x=1 to 18] and CF3(CF2)[x]CH2CH2SH[x=0 to 18] may be used. In addition, the fluorocarbon-based functional group (CFx) includes fluorobenzenethiol.

For example, the flow rates of the gaseous thiol-based organic compound and argon (Ar) are set to 100 sccm and 1,500 sccm, respectively, the internal pressure of the processing container of the film forming apparatus is set to 1 torr to 10 torr (133.32 Pa to 1,333.22 Pa), and the susceptor is heated such that the temperature of the substrate 10 becomes 150 degrees C. to 200 degrees C. As an example, step S105 may be performed in a processing container different from that in which step S104 is performed.

The thiol-based organic compound described above is a compound in which electron exchange with a metal is likely to occur. Accordingly, the SAM 13C has a property of being adsorbed on the surface of the conductive film 11 and being unlikely to be adsorbed on the surface of the insulating film 12 on which the exchange of electrons is unlikely to occur. Therefore, when film formation is performed while causing the thiol-based organic compound in the processing container, the SAM 13C is selectively formed only on the surface of the conductive film 11. The film thickness of the SAM 13C (the height of molecules of SAM 13C) is, for example, about 3 nm.

Therefore, through step S105, the SAM 13A is formed on the surface of the conductive film 11, and thus, as illustrated in FIG. 2E, the substrate 10 including the conductive film 11, the catalyst metal fine particles 13A, the CNTs 13B, and the SAM 13A formed in the first region A1 and the insulating film 12 formed in the second region A2 is obtained. Since the height of the CNTs 13B is higher than that of the SAM 13C, the CNTs 13B protrudes from the top surface of the SAM 13C. In FIG. 2E, the CNTs 13B, the SAM 13C, and the insulating film 12 are exposed on the surface of the substrate 10. In step S105, the selectivity of the thiol-based organic compound for forming the SAM 13C is used.

Figure 2F:
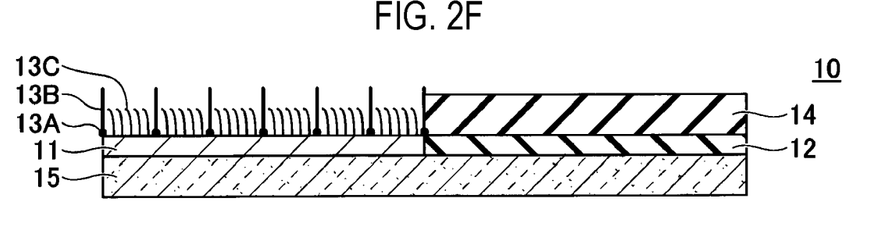
FIG. 2F is a cross-sectional view illustrating an example of a state of the substrate in each step illustrated in FIG. 1.

As illustrated in FIG. 2F, the film forming method includes step S106 of forming a target film 14 selectively in the second region A2 using the CNTs 13B and the SAM 13C. The target film 14 is formed of a material different from those of the CNTs 13B and the SAM, for example, a metal, a metal compound, or a semiconductor. Since the SAM 13C inhibits the formation of the target film 14, the target film 14 is formed selectively in the second region A2. When a third region is present in addition to the first region A1 and the second region A2, the target film 14 may or may not be formed in the third region.

Here, when the CNTs 13B are terminated with an alkyl group or a fluoro group, it is considered that the CNTs 13B also have a property of inhibiting the formation of the target film 14 like the SAM 13C, and assists the SAM 13C in inhibiting the formation of the target film 14. In this case, the formation of the target film 14 on the first region A1 may be inhibited using the CNTs 13B and the SAM 13C as a blocking layer.

The target film 14 is formed through, for example, a CVD method or an atomic layer deposition (ALD) method. The target film 14 is formed of, for example, an insulating material. The object film 14, which is an insulating film, may be selectively laminated on the insulating film 12 that is originally present in the second region A2.

The target film 14 is formed of, for example, an insulating material containing silicon. The insulating material containing silicon is, for example, silicon oxide (SiO), silicon nitride (SiN), silicon oxynitride (SiON), or silicon carbide (SIC).

As described above, according to the present embodiment, the natural oxide film 11A, which is present on the surface of the conductive film 11, is removed through a reduction process, and then the catalyst metal fine particles 13A made of Co are formed on the surface of the conductive film 11. Then, the CNTs 13B are grown vertically on the catalyst metal fine particles 13A using Co as a catalyst metal. In addition, using the selectivity of the thiol-based organic compound for producing the SAM 13C, the SAM 13C is formed on the surface of the conductive film 11 in the gaps between the molecules of the CNT 13B.

Since the CNTs 13B grow vertically on the surface of the conductive film 11 due to the vertical orientation, the SAM 13C adsorbed on the surface of the conductive film 11 through the gaps between the molecules of the CNT 13B is corrected by the CNTs 13B to grow in the vertical direction. In this way, by using the CNTs 13B, the shape of the SAM 13C can be controlled such that the SAM 13C grows vertically.

Therefore, the side surface of the SAM 13C (the side surface generated in the film thickness direction) at the boundary between the first region A1 and the second region A2 is vertical to the surface of the conductive film 11. That is, the shape of the SAM 13C can be controlled such that the boundary adjacent to the second region A2 on which the target film 14 is formed has an upright shape.

Therefore, it is possible to provide a film forming method capable of controlling the shape of the SAM 13C. The upright shape is not limited to the case in which the side surface of the SAM 13C is strictly vertical to the surface of the conductive film 11, but also includes a case in which the side surface of the SAM 13C is deviated from the vertical due to a manufacturing error or the like.

In addition, the side surface of the target film 14, which is formed adjacent to the side surface of the SAM 13C, at the boundary between the first region A1 and the second region A2 is vertical to the surfaces of the conductive film 11 and the insulating film 12. The fact that the target film 14 has a vertical side surface as described above is very effective in dealing with nanometer-level miniaturization in a semiconductor manufacturing process or the like after removing the CNTs 13B and the SAM 13C by etching.

Therefore, according to the film forming method according to the present embodiment, it is possible to deal with the nanometer-level miniaturization so that a highly productive semiconductor manufacturing process can be realized.

In the foregoing, the mode in which the CNTs 13B are grown by generating microwave plasma has been described, but the present disclosure is not limited to the microwave plasma. The CNTs 13B may be grown through thermal CVD or the like.

In addition, in the foregoing, the mode in which the processes of steps S101 to S104 are performed in the same processing container, and the process of forming the SAM 13C in step S105 and the process of forming the target film 14 in step S106 are performed in different processing containers have been described.

However, steps S101 and S102 and steps S103 and S014 may be performed in separate processing containers, respectively.

In addition, the process of forming the CNTs 13B in step S104 may be performed in a processing container different from that for the processes in steps S101 to S103. The processing container may be appropriately divided according to the conditions of the process for forming the CNT 13B or the like.

Second Embodiment

Figure 3:
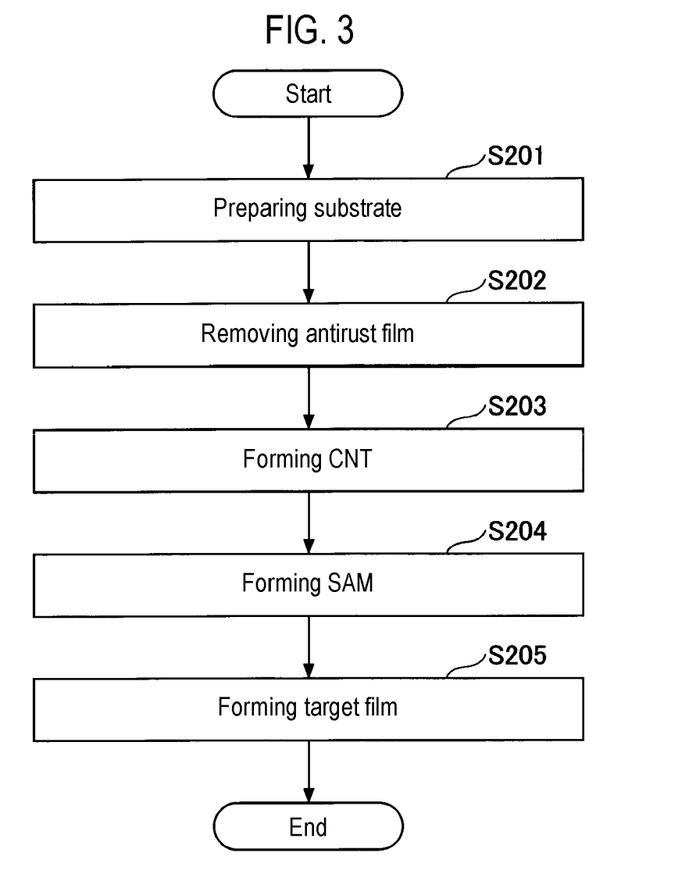
FIG. 3 is a flowchart illustrating a film formation method according to a second embodiment.

FIG. 3 is a flowchart illustrating a film forming method according to a second embodiment. FIGS. 4A to 4E are cross-sectional views illustrating examples of states of a substrate in respective steps illustrated in FIG. 3. FIGS. 4A to 4E illustrate the states of a substrate 20 corresponding to respective steps S201 to S205 illustrated in FIG. 3.

Figure 4A:
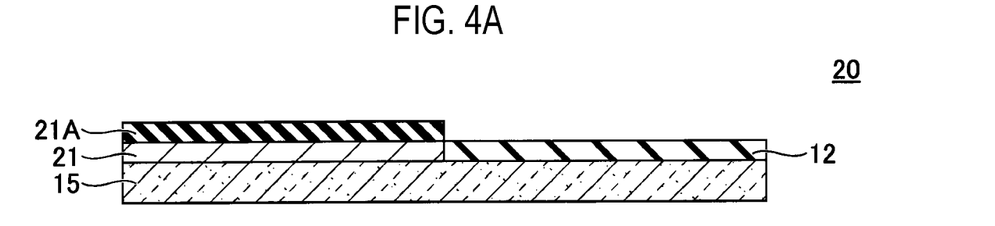
FIG. 4A is a cross-sectional view illustrating an example of a state of a substrate in each step illustrated in FIG. 3.

As illustrated in FIG. 4A, the film forming method includes step S201 of preparing the substrate 20. The preparing the substrate 20 includes, for example, loading the substrate 20 into a processing container of, for example, a film forming apparatus. The substrate 20 includes a conductive film 21, an antirust film 21A, an insulating film 12, and a base substrate 15.

The substrate 20 has a structure in which the copper (Cu) conductive film 11 and the natural oxide film 11A of the substrate 10 illustrated in FIG. 2A are replaced with the cobalt (Co) conductive film 21 and the antirust film 21A, respectively.

The substrate 20 has a first region A1 and a second region A2. The antirust film 21A is provided on one surface (the top surface in FIG. 4A) of the conductive film 21. That is, in FIG. 4D, the antirust film 21A and the insulating film 12 are exposed on the surface of the substrate 20.

The antirust film 21A is, for example, a film which is coated with an antirust shield for protecting the surface of Cu as the conductive film 21 from oxidation and sulfidation (applied with an antirust coating). A specific example of the antirust film 21 is a film made of benzotriazole (BAT). The antirust film 21A is formed on the surface of the conductive film 21.

Figure 4B:
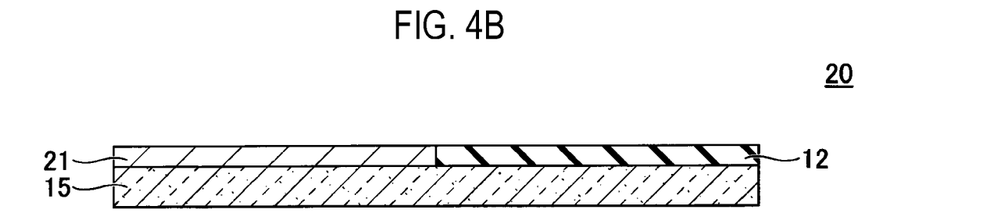
FIG. 4B is a cross-sectional view illustrating an example of a state of the substrate in each step illustrated in FIG. 3.

The film forming method includes step S202 of removing the antirust film 21A from the surface of the conductive film 21 as illustrated in FIG. 4B. For example, the antirust film 21A may be removed by heating the susceptor such that the temperature of the substrate 20 becomes about 350 degrees C. in a hydrogen atmosphere with an atmospheric gas containing hydrogen (H2) and argon (Ar). The antirust film 21A is removed through heat treatment using hydrogen.

Figure 4C:
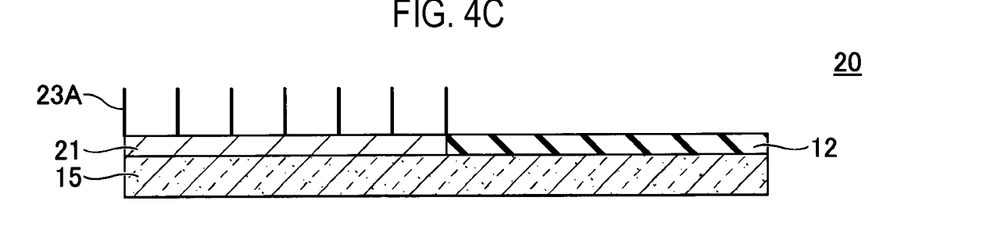
FIG. 4C is a cross-sectional view illustrating an example of a state of the substrate in each step illustrated in FIG. 3.

As illustrated in FIG. 4C, the film forming method includes step S203 of forming CNTs 23A. The CNTs 23A are formed on the surface of the conductive film 21 and grows vertically on the surfaces of the substrate 10 and the conductive film 21 in the first region A1. The CNTs 23A, together with an SAM 23B formed later, inhibits the formation of a target film 14 to be described later. The CNTs 23A are not formed in the second region A2.

In the present embodiment, since the conductive film 21 is a Co film having an action as a catalyst, the CNTs 23A may be directly grown on the surface of the conductive film 21 by decomposing a carbon-containing gas (a carbon source gas) such as methane (CH4), ethylene (C2H4), ethane (C2H6), or propylene (C3H6) hyplasma. The CNTs 23A grow vertically on the surface of the conductive film 21 due to a vertical orientation.

In order to directly grow the CNTs 23A on the surface of the conductive film 21, the same process as that in step S104 of the first embodiment may be performed. The height of the CNTs 23A is preferably higher than that of the target film 14, and is, for example, about 10 nm to 25 nm.

By step S203, as illustrated in FIG. 4C, the CNTs 23A are formed on the surface of the conductive film 21, and thus the substrate 20 including the conductive film 21, the insulating film 12, the CNTs 23A, and the base substrate 15 is obtained. In FIG. 4C, the conductive film 21, the CNTs 23A, and the insulating film 12 are exposed on the surface of the substrate 20. There are gaps between the CNTs 23A, and the conductive film 21 is exposed from the gaps. As an example, step S203 may be performed in the same processing container in which step S202 is performed.

Figure 4D:
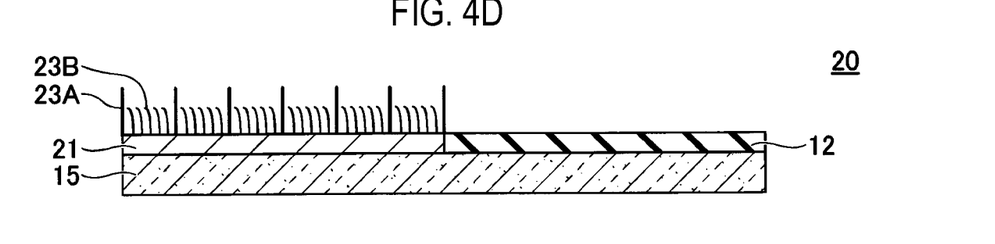
FIG. 4D is a cross-sectional view illustrating an example of a state of the substrate in each step illustrated in FIG. 3.
Figure 4E:
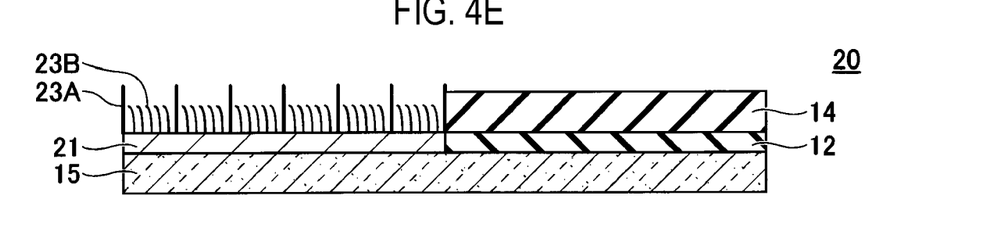
FIG. 4E is a cross-sectional view illustrating an example of a state of the substrate in each step illustrated in FIG. 3.

The film forming method includes step S204 of forming the SAM 23B as illustrated in FIG. 4D, and step S205 of forming the target film 14 selectively in the second region A2 using the CNTs 23A and the SAM 23B as illustrated in FIG. 4E. Steps S204 and S205 are the same as steps S105 and S106 of the first embodiment, respectively.

As described above, according to the present embodiment, the antirust film 21A on the surface of the conductive film 21 is removed, and then the CNTs 23A are grown vertically on the surface of the conductive film 21. In addition, using the selectivity of the thiol-based organic compound for producing the SAM 28B, the SAM 23B is formed on the surface of the conductive film 21 in the gaps between the molecules of the CNT 13B.

Since the CNTs 23A grow vertically on the surface of the conductive film 21 due to the vertical orientation, the SAM 23B adsorbed on the surface of the conductive film 21 through the gaps between the molecules of the CNT 23A is corrected and grows in the vertical direction by the CNTs 23A. In this way, by using the CNTs 23A, the shape of the SAM 23B can be controlled such that the SAM 23N grows vertically.

Therefore, the side surface of the SAM 23B (the side surface generated in the film thickness direction) at the boundary between the first region A1 and the second region A2 is vertically to the surface of the conductive film 21. That is, the shape of the SAM 23B can be controlled such that the boundary adjacent to the second region A2 on which the target film 14 is formed has an upright shape.

Therefore, it is possible to provide a film forming method capable of controlling the shape of the SAM 23B.

In addition, the side surface of the target film 14, which is formed adjacent to the side surface of the SAM 13C, at the boundary between the first region A1 and the second region A2 is vertical to the surfaces of the conductive film 21 and the insulating film 12. The fact that the target film 14 has a veliical side surface as described above is very effective in dealing with nanometer-level miniaturization in a semiconductor manufacturing process or the like after removing the CNTs 23A and the SAM 23B by etching.

Therefore, according to the film forming method according to the present embodiment, it is possible to deal with the nanometer-level miniaturization so that a highly productive semiconductor manufacturing process can be realized.

In the foregoing, the mode in which the anti.rust film 21A is provided on the surface of the conductive film 21, and thus the CNTs 23A are formed after removing the anti.rust film 21A has been described. However, when the anti.rust film 21A is not provided, the oxide film on the surface of the conductive film 21 may be reduced and removed. The reduction process may be implemented by causing the H2 gas to flow into the processing container and performing an annealing process at, for example, about 350 degrees C.

In addition, when forming the CNTs 23A on the surface of the conductive film 21 in step S203, catalyst metal fine particles may be formed on the surface of the conductive film 21 and then the CNTs 23A may be formed as in the first embodiment. The catalyst metal fine particles may be made of a metal having a catalytic action in the formation of the CNTs 23A, and may be made of, for example, Co.

<Film Forming System>

Next, a system for carrying out the film forming method according to the embodiment of the present disclosure will be described.

The film forming method according to an embodiment of the present disclosure may be executed in any of a batch apparatus, a single-wafer apparatus, and a semi-batch apparatus. However, the optimum temperature may differ in each of the above steps, and the execution of each step may be hindered when the surface of a substrate is oxidized and thus a state of the surface is changed. In view of this point, a multi-chamber-type single-wafer film forming system, in which each step can be easily set to an optimum temperature and all steps can be performed in a vacuum, is appropriate.

Hereinafter, this multi-chamber-type single-wafer film forming system will be described.

Figure 5:
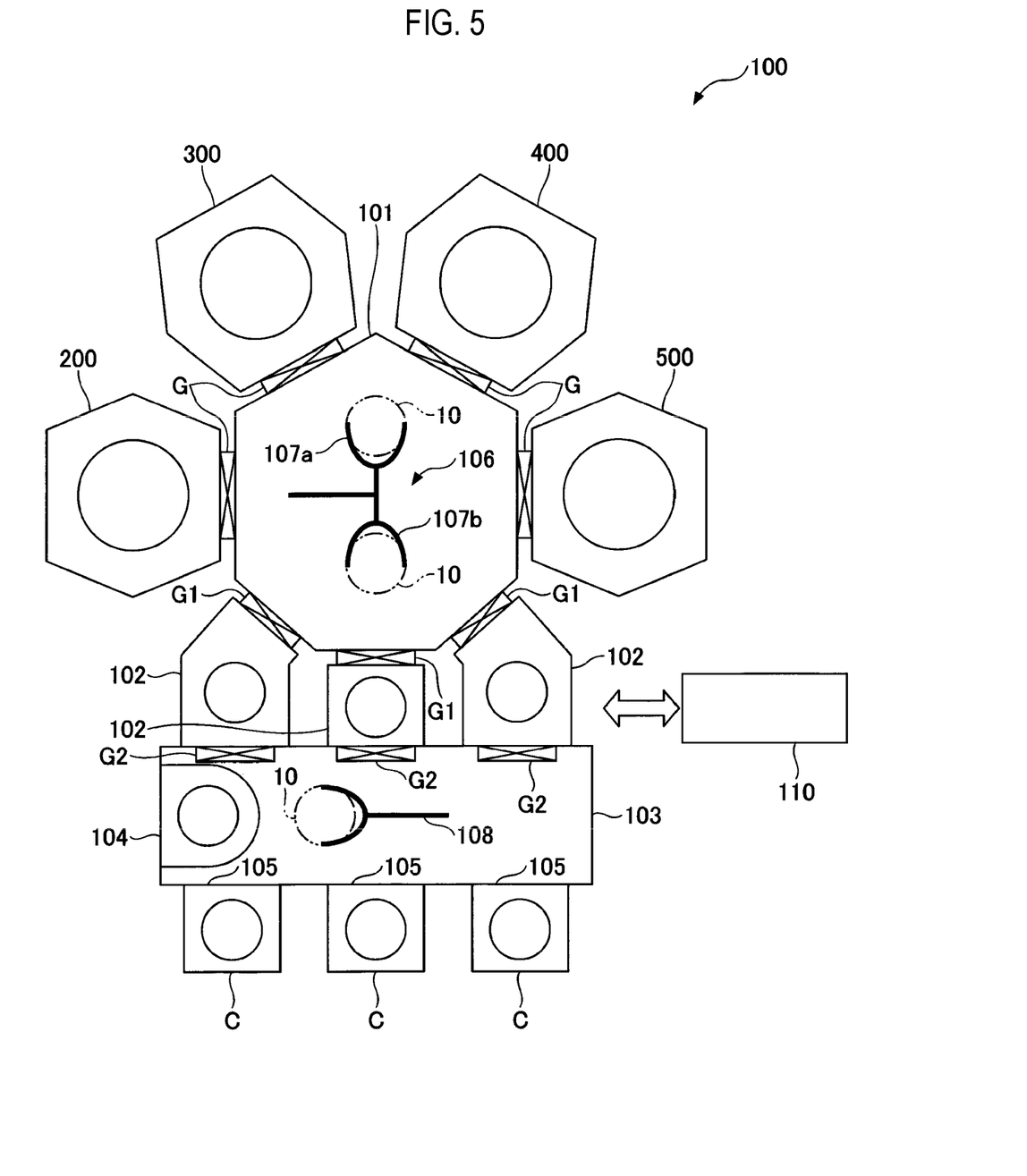
FIG. 5 is a schematic view illustrating an example of a film forming system for executing a film forming method according to an embodiment.

FIG. 5 is a schematic view illustrating an example of the film forming system for executing the film forming method according to the embodiment. Here, unless otherwise specified, a case in which a process is performed on the substrate 10 will be described.

As illustrated in FIG. 5, a film forming system 100 includes a reduction/oxidation processing apparatus 200, an SAM forming apparatus 300, a target film forming apparatus 400, and a processing apparatus 500. These apparatuses are connected to four walls of a vacuum transfer chamber 101 having a heptagonal shape in a plan view via gate valves G, respectively. The interior of the vacuum transfer chamber 101 is evacuated by a vacuum pump, and is maintained at a predetermined degree of vacuum. That is, the film forming system 100 is a multi-chamber-type vacuum-processing system, and is capable of continuously carrying out the above-described film forming method without breaking a vacuum state.

The oxidation/reduction processing apparatus 200 is a processing apparatus used when the reduction process of the substrate 10 (see FIG. 2A) is performed in a processing apparatus different from those for the catalyst metal fine particles 13A and the CNT 13B.

The SAM forming apparatus 300 is an apparatus that selectively forms an SAM 13C or 13B by supplying a thiol-based organic component for forming the SAM 13C or 23B in order to form the SAM 13C on the substrate 10 (see FIG. 2D) or the SAM 23B on the substrate 20 (see FIG. 4D).

The target film forming apparatus 400 is an apparatus that forms a silicon oxide (SiO) film or the like as a target film 14 on the substrate 10 (see FIG. 2E) and the substrate 20 (see FIG. 4F) through CVD or ALD.

The processing apparatus 500 is an apparatus that performs a reduction process for the substrate 10 (see FIG. 2A), a process for forming the catalyst fine particles 13A on the substrate 10 (see FIGS. 2B and 2C), a process for forming the CNTs 13B or 23A (see FIGS. 2D and 4C), and a process for removing the SAM 13C or 23B (see FIGS. 2E and 4D) by etching.

Three load-lock chambers 102 are connected to the other three walls of the vacuum transfer chamber 101 via gate valves G1, respectively. An atmospheric transfer chamber 103 is provided on the side opposite to the vacuum transfer chamber 101, with the load-lock chambers 102 interposed therebetween. The three load-lock chambers 102 are connected to the atmospheric transfer chamber 103 via the gate valves G2, respectively. The load-lock chambers 102 perform pressure control between the atmospheric pressure and the vacuum when the substrate 10 is transferred between the atmospheric transfer chamber 103 and the vacuum transfer chamber 101.

The wall of the atmospheric transfer chamber 103 opposite to the wall, on which the load-lock chambers 102 are mounted, includes three carrier mounting ports 105 in each of which a carrier (a FOUP or the like) C for accommodating the substrate 10 is installed. In addition, on a side wall of the atmospheric transfer chamber 103, an alignment chamber 104 configured to perform alignment of the substrate 10 is provided. The atmospheric transfer chamber 103 is configured to form a down-flow of clean air therein.

In the vacuum transfer chamber 101, a first transfer mechanism 106 is provided. first The transfer mechanism 106 transfers the substrate 10 to the reduction/oxidation processing apparatus 200, the SAM forming apparatus 300, the target film forming apparatus 400, the processing apparatus 500, and the load-lock chambers 102. The first transfer mechanism 106 includes two independently-movable transfer arms 107a and 107b.

A second transfer mechanism 108 is provided inside the atmospheric transfer chamber 103. The second transfer mechanism 108 is configured to transfer the substrate 10 to the carriers C, the load-lock chambers 102, and the alignment chamber 104.

The film forming system 100 includes an overall controller 110. The overall controller 110 includes a main controller equipped with a CPU (a computer), an input device (a keyboard, a mouse, or the like), an output device (e.g., a printer), a display device (a display or the like), and a storage device (a storage medium). The main controller controls respective components of the oxidation/reduction processing apparatus 200, the SAM forming apparatus 300, the target film forming apparatus 400, the processing apparatus 500, the vacuum transfer chamber 101, and the load-lock chambers 102. The main controller of the overall controller 110 causes the film forming system 100 to execute operations for carrying out the film forming methods of the first and second embodiments based on a processing recipe stored in, for example, a storage medium embedded in the storage device or set in the storage device. Each apparatus may be provided with a lower-level controller, and the overall controller 110 may be configured as an upper-level controller.

In the film forming system configured as described above, the second transfer mechanism 108 takes out the substrate 10 from the carrier C connected to the atmospheric transfer chamber 103, passes through the alignment chamber 104, and then loads the substrate 10 into one of the load-lock chambers 102. Then, after the interior of the load-lock chamber 102 is evacuated, the first transfer mechanism 106 transfers the substrate 10 to the reduction/oxidation processing apparatus 200, the SAM forming apparatus 300, the target film forming apparatus 400, and the processing apparatus 500 so as to perform the film forming processes of the first or second embodiment. Then, if necessary, the processing apparatus 500 removes the SAM 13C by etching.

After the above-described processes are completed, the substrate 10 is transferred to one of the load-lock chambers 102 by the first transfer mechanism 106, and the substrate 10 inside the load-lock chamber 102 is returned to the carrier C by the second transfer mechanism 108.

By performing the above-described processes on the plurality of substrates 10 in a simultaneous and parallel manner, selective film forming processes on a predetermined number of substrates IO arc completed.

Since each of these processes is performed by an independent single-wafer apparatus, it is easy to set the optimum temperature for each process, and since a series of processes can be performed without breaking a vacuum state, it is possible to suppress oxidation during the processes.

Examples of Film Forming and SAM Forming Apparatus

Next, examples of the oxidation/reduction processing apparatus 200, a film forming apparatus such as the target film forming apparatus 400, and the SAM forming apparatus 300 will be described.

Figure 6:
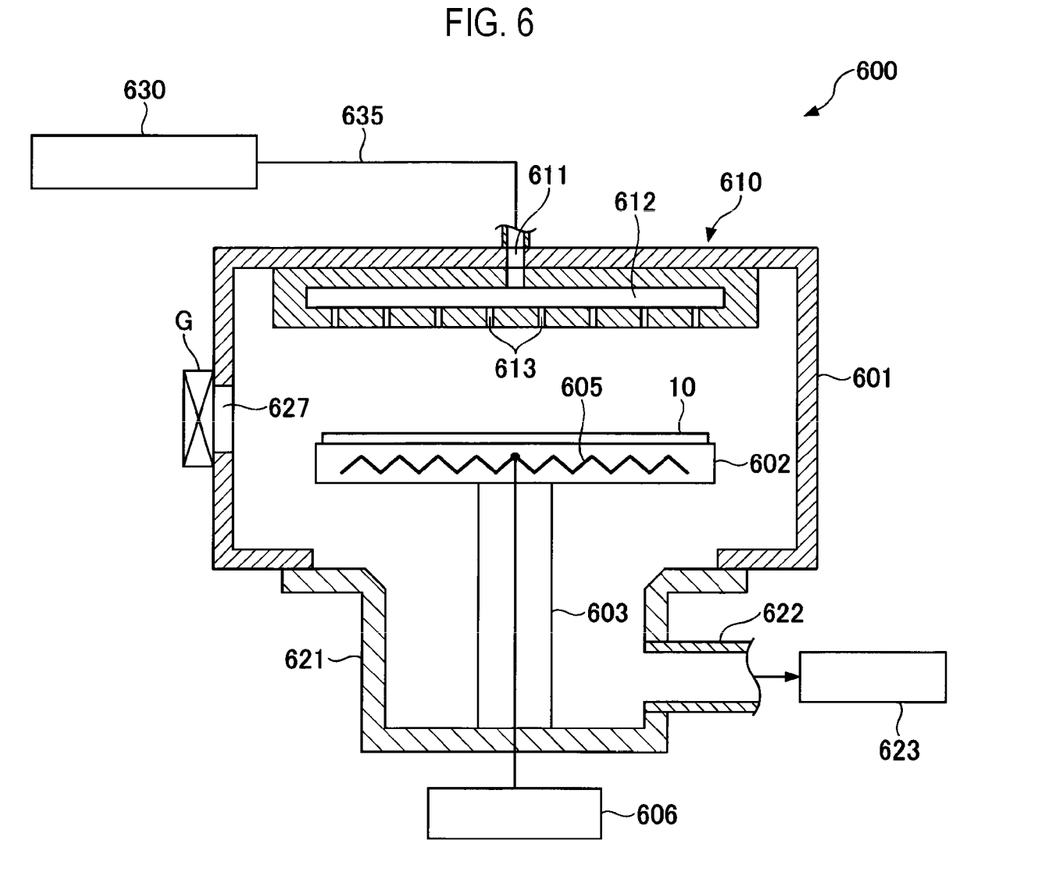
FIG. 6 is a cross-sectional view illustrating an example of a processing apparatus that is capable of being used as a film forming apparatus and an SAM forming apparatus.

FIG. 6 is a cross-sectional view illustrating an example of a processing apparatus that can be used as the film forming apparatus and the SAM forming apparatus.

The oxidation/reduction processing apparatus 200, the film forming apparatus such as the target film forming apparatus 400, and the SAM forming apparatus 300 may be configured as apparatuses having similar configurations, and may be configured as, for example, a processing apparatus 600 illustrated in FIG. 6.

The processing apparatus 600 includes a substantially cylindrical processing container (chamber) 601 configured to be hermetically sealed, and a susceptor 602 configured to horizontally support the substrate 10 thereon is disposed inside the processing container 601 to be supported by a cylindrical support member 603 provided in the center of the bottom wall of the processing container 601. A heater 605 is embedded in the susceptor 602. The heater 605 heats the substrate 10 to a predetermined temperature by being fed with power from a heater power supply 606. The susceptor 602 is provided with a plurality of wafer lifting pins (not illustrated) to move upward and downward with respect to the surface of the susceptor 602 so as to support and raise/lower the substrate 10.

A shower head 610 configured to introduce a processing gas for forming a film or an SAM into the processing container 601 in the form of a shower is provided on the ceiling wall of the processing container 601 to face the susceptor 602. The shower head 610 is provided to eject a gas supplied from a gas supply mechanism 630, which will be described later, into the processing container 601. A gas inlet port 611 for gas introduction is formed in the upper portion of the shower head 610. A gas diffusion space 612 is formed inside the shower head 610, and a large number of gas ejection holes 613 communicating with the gas diffusion space 612 are formed in the bottom surface of the shower head 610.

The bottom wall of the processing container 601 is provided with an exhaust chamber 621, which protrudes downwards. An exhaust pipe 622 is connected to the side surface of the exhaust chamber 621, and an exhaust apparatus 623 including a vacuum pump, a pressure control valve and the like is connected to the exhaust pipe 622. By operating the exhaust apparatus 623, the interior of the processing container 601 can be brought into a predetermined depressurized (vacuum) state.

A loading/unloading port 627 for loading/unloading the substrate 10 to/from the vacuum transfer chamber 101 is provided in the side wall of the processing container 601. The loading/unloading port 627 is opened and closed by a gate valve G.

The gas supply mechanism 630 includes, for example, sources of gases necessary for forming the target film 14 or the SAM 13C, individual pipes for supplying gas from respective sources, an opening/closing valve provided in each of the individual pipes, and a flow rate controller such as a mass flow controller that performs flow rate control of a gas, and further includes a gas supply pipe 635 configured to guide a gas from each of the individual pipes through the gas inlet port 611.

When the processing apparatus 600 performs ALD film formation of silicon oxide (SiO) as the target film 14, the gas supply mechanism 630 supplies a raw material gas of an organic compound and a reaction gas to the shower head 610. In addition, when the processing apparatus 600 forms an SAM, the gas supply mechanism 630 supplies vapor of a compound for forming the SAM into the processing container 601. The gas supply mechanism 630 is configured to be able to supply an inert gas such as a N2 gas or an Ar gas as a purge gas or a heat transfer gas as well.

In the processing apparatus 600 configured as described above, the gate valve G is opened, and the substrate 10 is loaded into the processing container 601 through the loading/unloading port 627, and is placed on the susceptor 602. Since the susceptor 602 is heated to a predetermined temperature by the heater 605, the wafer is heated when the inert gas is introduced into the processing container 601. Then, the interior of the processing container 601 is evacuated by the vacuum pump of the exhaust apparatus 623 such that the internal pressure of the processing container 601 is adjusted to a predetermined pressure.

Subsequently, when the processing apparatus 600 performs ALD film formation of silicon oxide (SiO) as the target film 14, supply of the raw material gas of the organic compound and supply of the reaction gas from the gas supply mechanism 630 are alternately performed, with purging of the interior of the processing container 601 interposed between the supply of the raw material gas and the supply of the reaction gas. When the processing apparatus 600 forms an SAM, the gas supply mechanism 630 supplies the vapor of the organic compound for forming the SAM into the processing container 601.

Although embodiments of the substrate processing method according to the present disclosure have been described above, the present disclosure is not limited to the above-described embodiments. Various changes, modifications, substitutions, additions, deletions, and combinations can be made within the scope of the claims. Of course, these also fall within the technical scope of the present disclosure.

The present international application claims priority based on Japanese Patent Application No. 2019-173471 filed on Sep. 24, 2019, the disclosure of which is incorporated herein in its entirety by reference.

EXPLANATION OF REFERENCE NUMERALS 10, 20: substrate, 11, 21: conductive film, 11A: natural oxide film, 12: insulating film, 13A: catalyst metal fine particles, 13B, 23A: CNT, 13C, 23B: SAM, 14: target film, 15: base substrate, 21A: antirust film

What is claimed is:

1. A film forming method of forming a target film on a substrate, the film forming method comprising:
preparing a substrate including a layer of a first conductive material formed on a surface of a first region, and a layer of an insulating material formed on a surface of a second region;
forming carbon nanotubes on a surface of the layer of the first conductive material; and
supplying a raw material gas for a self-assembled film to form the self-assembled film in a region of the surface of the layer of the first conductive material in which the carbon nanotubes have not been formed.

2. The film forming method of claim 1, further comprising:
reducing an oxide layer on the surface of the layer of the first conductive material after the preparing the substrate and before the forming the carbon nanotubes.

3. The film forming method of claim 2, further comprising:
forming, on the surface of the layer of the first conductive material, particles of a second conductive material that causes a catalytic reaction in the forming the carbon nanotubes,
wherein, in the forming the carbon nanotubes, the carbon nanotubes are formed on the particles on the surface of the layer of the first conductive material.

4. The film forming method of claim 3, wherein the second conductive material is cobalt or nickel.

5. The film forming method of claim 4, wherein the first conductive material is copper, cobalt, or nickel.

6. The film forming method of claim 5, wherein the insulating material is an insulating material containing silicon.

7. The film forming method of claim 6, wherein a material of the self-assembled film is a material of a thiol-based self-assembled film.

8. The film forming method of claim 7, further comprising:
forming the target film on a surface of the layer of the insulating material.

9. The film forming method of claim 1, further comprising:
removing an antirust agent on the surface of the layer of the first conductive material after the preparing the substrate and before the forming the carbon nanotubes.

10. The film forming method of claim 1, further comprising:
forming, on the surface of the layer of the first conductive material, particles of a second conductive material that causes a catalytic reaction in the forming the carbon nanotubes,
wherein, in the forming the carbon nanotubes, the carbon nanotubes are formed on the particles on the surface of the layer of the first conductive material.

11. The film forming method of claim 1, wherein the first conductive material is copper, cobalt, or nickel.

12. The film forming method of claim 1, wherein the insulating material is an insulating material containing silicon.

13. The film forming method of claim 1, wherein a material of the self-assembled film is a material of a thiol-based self-assembled film.

14. The film forming method of claim 1, further comprising:
   forming the target film on a surface of the layer of the insulating material.

* * * * *